(12) United States Patent
Kim et al.

(10) Patent No.: US 9,376,341 B2
(45) Date of Patent: Jun. 28, 2016

(54) SUPERHYDROPHOBIC SUBSTRATE AND METHOD OF MANUFACTURING THE SAME

(71) Applicant: LG CHEM, LTD., Seoul (KR)

(72) Inventors: Tae-Su Kim, Daejeon (KR); Hyeon Choi, Daejeon (KR); Bu-Gon Shin, Daejeon (KR); Jae-Jin Kim, Daejeon (KR); Jong-Byung Lee, Daejeon (KR); Su-Jin Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/951,180

(22) Filed: Jul. 25, 2013

(65) Prior Publication Data

US 2013/0309451 A1    Nov. 21, 2013

Related U.S. Application Data

(63) Continuation of application No. PCT/KR2012/010040, filed on Nov. 26, 2012.

(30) Foreign Application Priority Data

Nov. 25, 2011 (KR) .................. 10-2011-0124442
Nov. 23, 2012 (KR) .................. 10-2012-0133682

(51) Int. Cl.
*C03C 15/00* (2006.01)
*B81C 1/00* (2006.01)

(52) U.S. Cl.
CPC ............. *C03C 15/00* (2013.01); *B81C 1/00206* (2013.01); *B81B 2203/0361* (2013.01); *Y10T 428/24355* (2015.01)

(58) Field of Classification Search
CPC .... C03C 15/00; C08J 7/00; Y10T 428/24355; G02B 1/111; B81C 1/00206; B81B 2203/0361
USPC ........................................................ 428/141
See application file for complete search history.

(56) References Cited

U.S. PATENT DOCUMENTS

2007/0139783 A1*  6/2007  Furuya et al. ................. 359/606
2007/0231542 A1* 10/2007  Deng et al. .................... 428/141
2010/0021692 A1   1/2010  Bormashenko et al.

FOREIGN PATENT DOCUMENTS

| JP | 11-171592 | 6/1999 |
|----|-----------|--------|
| JP | P2003236955 A | 8/2003 |
| JP | 2005-069190 | 3/2005 |
| JP | P2006-083244 A | 3/2006 |
| JP | 2007-086255 | 4/2007 |

(Continued)

OTHER PUBLICATIONS

Samaha et al., "Modeling drag reduction and meniscus stability of superhydrophobic surfaces comprised of random roughness", Physics of Fluids, Jan. 2011 (online), vol. 23, 012001, pp. 1-8.

(Continued)

*Primary Examiner* — Nathan Van Sell
(74) *Attorney, Agent, or Firm* — Dentons US LLP

(57) ABSTRACT

There is provided a superhydrophobic substrate comprising a plurality of protrusions having a pseudo random distribution on one surface thereof, an average interval between respective protrusions among the plurality of protrusions being greater than an interval between light beam wave peaks of light within the visible spectrum, allowing the substrate to have durability and transparency secured therein.

9 Claims, 2 Drawing Sheets

(56) References Cited

FOREIGN PATENT DOCUMENTS

| | | |
|---|---|---|
| JP | 2012-126073 | 7/2012 |
| KR | 1020100008579 A | 1/2010 |
| KR | 1020100099387 A | 9/2010 |
| WO | 2008/084604 A1 | 7/2008 |
| WO | 2008136535 A1 | 11/2008 |

OTHER PUBLICATIONS

AIP Physics of Fluids: "Modeling drag of reduction and meniscus stability of superhydrophobic surfaces comprised of random roughness", Jan. 11, 2011.

* cited by examiner

SUPERHYDROPHOBIC SUBSTRATE AND METHOD OF MANUFACTURING THE SAME

CROSS-REFERENCE TO RELATED APPLICATIONS

This application is a bypass continuation of International Application No. PCT/KR2012/010040 filed Nov. 26, 2012, which claims the priorities of Korean Patent Application Nos. 10-2011-0124442 filed on Nov. 25, 2011, and 10-2012-0133682 filed on Nov. 23, 2012, in the Korean Intellectual Property Office, all of which are incorporated herein by reference.

BACKGROUND OF THE INVENTION

1. Field of the Invention

Aspects of embodiments relate to a superhydrophobic substrate, and more particularly, to a superhydrophobic substrate having a water contact angle of 140 degrees or greater and a method of manufacturing the same.

2. Description of the Related Art

A superhydrophobic substrate indicates a substrate having a water contact angle greater than that of a hydrophobic substrate according to the related art, by forming an air gap in an interface between a substrate and water through a concave-convex pattern formed in a substrate surface. An existing hydrophobic substrate has a contact angle of approximately 100 to 110 degrees, while a superhydrophobic substrate has a contact angle of 140 degrees or greater.

In general, a superhydrophobic substrate may be classified as a structure in which an interval between convex portions in a concave-convex pattern formed in a surface of the substrate (an average interval between the convex portions of the pattern) is smaller than an interval between light beam wave peaks of light within the visible spectrum, and a structure in which an interval between convex portions in a concave-convex pattern formed in a surface of the substrate is greater than an interval between light beam wave peaks of light within the visible spectrum. When the interval between the convex portions in the concave-convex pattern formed in a superhydrophobic substrate surface is greater than an interval between light beam wave peaks of light within the visible spectrum, since the interval between the convex portions in the concave-convex pattern is relatively great and durability is present but the substrate is opaque, visibility cannot be secured. When the interval between the convex portions in the concave-convex pattern formed in a superhydrophobic substrate surface is smaller than an interval between light beam wave peaks of light within the visible spectrum, since a substrate is transparent and visibility can be secured but the interval between the convex portions in the concave-convex pattern is relatively small, durability may be degraded and a manufacturing process may be complicated.

Meanwhile, as a method of manufacturing a superhydrophobic substrate, in general, there have been used a method of distributing nanoparticles to form a concave-convex pattern on a substrate, a method of forming a concave-convex pattern through a photolithography process, and a method of forming a concave-convex pattern using electrospraying, but the methods described above have been somewhat problematic, in that substrate surface characteristics, for example, the size and distribution of portions of a pattern formed in a substrate surface, and the like, and optical characteristics of a substrate, for example, transparency and the like, cannot be controlled.

SUMMARY OF THE INVENTION

An aspect of an embodiment provides a superhydrophobic substrate simultaneously having sufficient amounts of durability and transparency.

An aspect of an embodiment provides a method of manufacturing a superhydrophobic substrate able to control optical characteristics of the substrate.

An aspect of an embodiment provides a display device including a superhydrophobic substrate having durability and transparency secured therein.

An aspect of an embodiment provides window glass for a vehicle including a superhydrophobic substrate having durability and transparency secured therein.

An aspect of an embodiment provides a superhydrophobic substrate including: a plurality of protrusions 20 having a pseudo random distribution on one surface thereof, an average interval between respective protrusions 20 among the plurality of protrusions 20 being greater than an interval between light beam wave peaks of light within the visible spectrum.

An aspect of an embodiment provides a method of manufacturing a superhydrophobic substrate, including: a) fabricating a photomask including a plurality of light transmission parts or a plurality of light blocking parts, having a pseudo random distribution, an average interval between the plurality of light transmission parts or between the plurality of light blocking parts being greater than an interval between light beam wave peaks of light within the visible spectrum thereof; and b) forming a plurality of protrusions 20 on a substrate surface by using the photomask fabricated in a) the fabricating of the photomask.

BRIEF DESCRIPTION OF THE DRAWINGS

The above and other aspects, features and other advantages of the present invention will be more clearly understood from the following detailed description taken in conjunction with the accompanying drawings, in which.

DESCRIPTIONS WITH REGARD TO REFERENCE NUMERALS

Figure 1:
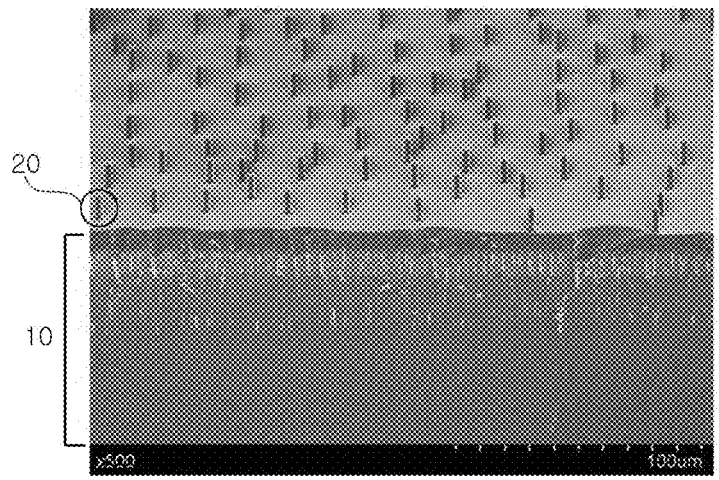
FIG. 1 illustrates a surface form of a superhydrophobic substrate according to an embodiment.

10: Substrate
20: Protrusion

DETAILED DESCRIPTION OF THE INVENTION

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

FIG. 1 illustrates a surface shape of a superhydrophobic substrate according to an embodiment. With reference to FIG. 1, a superhydrophobic substrate according to an embodiment may include a plurality of protrusions 20 on one surface of a substrate 10.

In this case, the substrate 10 is not particularly limited as long as the substrate 10 is transparent in a visible light region, for example, a substrate 10 formed of glass, polymethyl methacrylate (PMMA), polyethylene terephthalate (PET), polycarbonate (PC), polystyrene-block-polymethyl methacrylate (PS-b-PMMA), or the like, may be used.

On the other hand, in the present embodiment, the plurality of protrusions 20 formed in one surface of the substrate 10 may be arrayed in pseudo random fashion to have a pseudo random distribution. Here, 'pseudo random distribution' indicates a distribution satisfying at least one rule, even though the distribution is statistically illustrated randomly, and has an underlying concept in contrast to a truly random distribution, having a random distribution without any rules.

The pseudo random distribution may be provided through various pseudo random distribution formation methods known in the art, such as a random number generation function, a voronoi diagram, or the like, but this should not be construed as being limiting. Meanwhile, the random number generation function and voronoi diagrams are used in a variety of fields, for example, those of information technology, architecture, wireless communications, and the like. In the case of a random number generation function, a method of setting a specific condition and then generating values to have a random distribution within a range satisfying the setting condition is used, and the method may be implemented via a computer program. Further, in the case of the voronoi diagram, a method of forming distribution in pseudo random fashion, in which regions containing respective points are configured by a perpendicular bisector between a plurality of the points randomly distributed on a plane so as to satisfy a specific condition, can be used.

Meanwhile, in the present embodiment, the description 'the plurality of protrusions are arrayed in pseudo random fashion' provided above indicates that positions of respective protrusions 20 among the plurality of protrusions 20 are set randomly, but the plurality of protrusions 20 are adjusted and arrayed such that an average interval between the overall plurality of protrusions 20 is within a set range.

When the array of the plurality of protrusions 20 on a substrate is regular, it may be difficult to secure transparency due to refraction and light interference phenomena, and when the array of protrusions 20 on a substrate is truly randomly distributed, the transparency thereof may be improved, but it may be difficult to achieve uniform physical properties such as water repellency, water proofing, or the like. In comparison, according to the present embodiment, when a plurality of protrusions 20 have a pseudo random distribution and an average interval between respective protrusions 20 among the plurality of protrusions 20 is adjusted to be within a specific range, a superhydrophobic substrate having excellent transparency, water repellency, durability, and the like may be implemented.

On the other hand, in the present embodiment, an average interval between the plurality of protrusions 20 may be greater than a visible light wavelength so as to secure the durability of the superhydrophobic substrate. In detail, the average interval between respective protrusions 20 among the plurality of protrusions 20 may be in a range of around 0.4 µm to 100 µm, for example, around 1 µm to 50 µm, around 5 µm to 30 µm, around 0.4 µm to 10 µm, or around 10 µm to 100 µm.

When the average interval between respective protrusions 20 among the plurality of protrusions 20 is less than 0.4 µm, water-repellency properties may be degraded as well as difficulties in forming the protrusions 20 using a currently used etching process. When the average interval between respective protrusions 20 among the plurality of protrusions 20 exceeds 100 µm, the average interval between respective protrusions 20 among the plurality of protrusions 20 may be greater than a diameter of a water drop, such that required water-repellency properties may not be obtained.

In addition, in the present embodiment, the protrusions 20 may be provided such that the interval between respective protrusions 20 among the plurality of protrusions 20, adjacent to each other, satisfies normal distribution range. In a case in which interval between respective protrusions 20 among the plurality of protrusions 20 satisfy normal distribution range, a superhydrophobic substrate having both excellent water repellency and excellent transparency characteristics may be obtained. Here, an average value of the normal distribution may be an average interval between respective protrusions 20 among the plurality of protrusions 20, and a standard deviation value of the normal distribution may be 1/20 to 1/4 of the average value thereof. That is, the standard deviation of the normal distribution may be 1/20 to 1/4 of an average interval between respective protrusions 20 among the plurality of protrusions 20. In other words, the standard deviation value may satisfy the numerical range described above, such that physical properties of the superhydrophobic substrate may be particularly excellent.

The plurality of protrusions 20 may be diversely formed, for example, may have a cylindrical shape, a conical shape, a quadrangular pillar shape, or the like, but these should not be considered to be limiting.

In addition, a diameter of the protrusion 20 may be different according to an average interval between the respective protrusions 20 among the plurality of protrusions 20 having a pseudo random distribution. Here, the diameter of the protrusion 20 indicates a diameter of a portion of the protrusion 20, which contacts the substrate 10. For example, in the case of a conical protrusion 20, the diameter of the protrusion refers to a diameter of a lower circle, and in the case of a cylindrical protrusion 20, the diameter of the protrusion 20 refers to a diameter of a lower end of the cylinder. The diameter of the protrusion 20 may be within the range of approximately 5 to 30% of an average interval between respective protrusions 20 among the plurality of protrusions 20, for example, approximately 10 to 25%, approximately 15% to 20%, approximately 20% to 30%, or approximately 5 to 20%, of the average interval between respective protrusions 20 among the plurality of protrusions 20. When the diameter of the protrusion 20 is less than 5% of the average interval between respective protrusions 20 among the plurality of protrusions 20, durability of a pattern formed in the superhydrophobic substrate may be deteriorated, and when the diameter of the protrusion 20 exceeds 30% of the average interval between respective protrusions 20 among the plurality of protrusions 20, a haze value may be increased to degrade the transparency of the superhydrophobic substrate.

Further, a height of the protrusion 20 may be different according to an average interval between respective protrusions 20 among the plurality of protrusions 20 having the pseudo random distribution. Here, the height of the plurality of protrusions 20 may be within the range of approximately 15 to 90% of an average interval between respective protrusions 20 among the plurality of protrusions 20, for example, approximately 20 to 60%, approximately 30% to 50%, approximately 40% to 90%, or approximately 15 to 40%, of the average interval between respective protrusions 20 among the plurality of protrusions 20. In a case in which the height of the plurality of protrusions 20 is less than 15% of the average interval between respective protrusions 20 among the plurality of protrusions 20, it may be difficult to exhibit superhydrophobic properties, and in a case in which the height of the protrusion 20 exceeds 100%, durability of a pattern formed in the superhydrophobic substrate may be deteriorated.

The superhydrophobic substrate having the structure as described above may have a haze value of 2 or less. In order to secure transparency of products, for example, vehicles or the like, to which the superhydrophobic substrate as described above is applied, a haze value may be 2 or less. In the present embodiment, when incident light is passed through the superhydrophobic substrate and 100% thereof is scattered thereon, haze is 100, and when no scattering occurs, haze is 0. A haze value between 100 and 0 indicates a ratio value in which incident light is passed through the superhydrophobic substrate and is scattered thereon. Alternatively, the superhydrophobic substrate may have a haze value of 0.2 to 1.2 or a haze value of 0.5 to 1.0.

Figure 2:
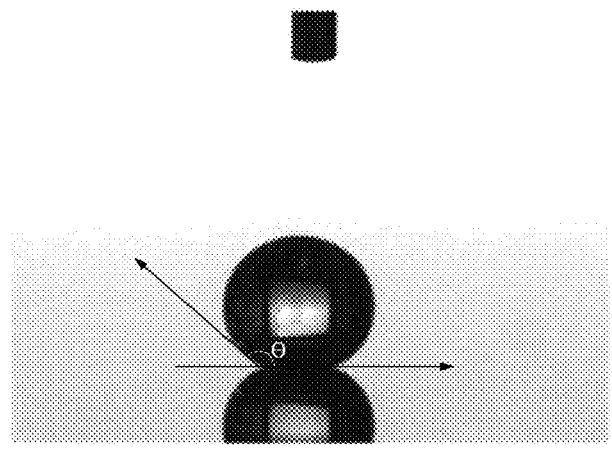
FIG. 2 illustrates a water contact angle on a superhydrophobic substrate according to an embodiment.

Meanwhile, FIG. 2 illustrates a contact angle on a superhydrophobic substrate according to an embodiment. With reference to FIG. 2, a superhydrophobic substrate according to an embodiment may have a contact angle of 140 degrees or greater, for example, 150 degrees or greater, which is why water is hardly formed but flows, that is, a superhydrophobic phenomenon appears at the contact angle of 140 degrees or greater. Here, the contact angle indicates an angle with respect to a substrate surface provided when a straight line is drawn on a liquid surface from a point at which liquid in a stationary state on a superhydrophobic substrate contacts the substrate 10.

On the other hand, a superhydrophobic substrate according to another embodiment may further include a coating layer formed of a hydrophobic material on a surface of the superhydrophobic substrate including the plurality of protrusions 20. The coating layer formed of a hydrophobic material may reinforce superhydrophobic properties of the substrate. The hydrophobic material may be fluorine-based compound, silane-based compound, or the like, for example, polytetrafluoroethylene (PTFE), siloxane, or the like.

The superhydrophobic substrate according to the embodiment may be used in various fields employing, for example, vehicle glass, transparent substrates for a display device, display devices for mobile phones, camera lens, and the like.

In addition, since the superhydrophobic substrate according to the embodiment has an average interval between respective protrusions 20 among the plurality of protrusions 20 greater than a visible light wavelength, the plurality of protrusions 20 may be formed through a photolithography process using a light source having a relatively long wavelength band, a roll embossing method, a roll-to-roll printing method, or the like, thereby facilitating the application thereof to a large area of substrate.

Subsequently, a method of manufacturing a superhydrophobic substrate according to an embodiment will be described.

A method of manufacturing a superhydrophobic substrate according to an embodiment may include a) fabricating a photomask and b) forming a plurality of protrusions 20 on a substrate surface by using the photomask fabricated in a) the fabricating of the photomask.

In a) the fabricating of the photomask, a photomask including a plurality of light transmission parts (in a case in which negative photosensitizer is applied to the substrate 10) or a plurality of light blocking parts (in a case in which positive photosensitizer is applied to the substrate 10), having a pseudo random distribution, may be fabricated. This may be performed to allow the plurality of protrusions 20 formed in the substrate 10 to be arrayed in the pseudo random fashion to have a pseudo random distribution by using the photomask. When the plurality of protrusions 20 have the pseudo random distribution, the size of the plurality of protrusions 20 and an interval between respective protrusions 20 among the plurality of protrusions 20 may be adjusted, whereby optical properties such as transparency of a substrate 10 and the like may be controlled.

The plurality of light transmission parts and light blocking parts having the pseudo random distribution may be formed using a pseudo random distribution formation method generally used in the art, for example, a method of design of a pattern using a random number generation function, a voronoi diagram, or the like.

For example, the plurality of light transmission parts or light blocking parts may be formed by setting at least one of an average interval between required protrusions 20 and a standard deviation value of required protrusions 20, subsequently generating values satisfying a pseudo random distribution by using a random number generation function, and forming a pattern corresponding to a light transmission part or a light blocking part in positions corresponding to the generated values.

Figures 3A, 3B, 3C:
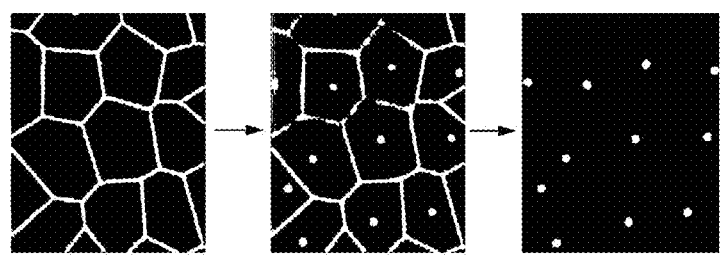
FIG. 3A to 3C illustrates a method of design of a pattern using a voronoi diagram, used to fabricate a photomask used in a superhydrophobic substrate manufacturing method.

Meanwhile, FIG. 3A to 3C illustrates a method of design of a pattern using a voronoi diagram. With reference to FIG. 3A to 3C, method of design of the pattern using the voronoi diagram may include forming a unit-cell region inconsideration of an average interval between corresponding protrusions 20 (see FIG. 3A); forming a pattern corresponding to a light transmission part or a light blocking part in the center of gravity of a unit-cell (see FIG. 3B); and eliminating the voronoi diagram pattern (see FIG. 3C).

On the other hand, an average interval between the light transmission parts or between the light blocking parts may be greater than an interval between light beam wave peaks of light within the visible spectrum. In detail, the average interval between the light transmission parts or between the light blocking parts may be within the range of approximately 0.4 μm to 100 μm, for example, approximately 1 μm to 50 μm, approximately 5 μm to 30 μm, approximately 0.4 μm to 10 μm, or approximately 10 μm to 100 μm. When the average interval between the light transmission parts or between the light blocking parts is less than 0.4 μm, it may be difficult to form a pattern using a currently used photolithography scheme, and when the average interval between the light transmission parts or between the light blocking parts exceeds 100 μm, the average interval between respective protrusions 20 among the plurality of protrusions 20 may be greater than a diameter of a water drop, such that required water-repellency properties may not be obtained.

In addition, a diameter of a pattern of the light transmission part or the light blocking part may be different depending upon an average interval between the light transmission parts or the light blocking parts. In detail, the diameter of the light transmission part or the light blocking part may be within the range of approximately 5 to 30% of an average interval between the light transmission parts or the light blocking parts, for example, approximately 10 to 25%, approximately 15% to 20%, approximately 20% to 30%, or approximately 5 to 20%, of the average interval between the light transmission parts or the light blocking parts. When the diameter of the light transmission part or the light blocking part is less than 5% of the average interval between the light transmission parts or the light blocking parts, durability of a pattern formed in the superhydrophobic substrate may be deteriorated, and when the diameter of the light transmission part or the light blocking part exceeds 30%, haze may be increased to degrade the transparency of the superhydrophobic substrate.

Meanwhile, b) the process of forming the plurality of protrusions 20 on the substrate 10 may be performed by applying a photosensitizer to a substrate surface and allowing ultraviolet light to be irradiated thereonto using the photomask fabricated in a) the photomask fabricating process to form the plurality of protrusions 20 on the substrate surface.

In this case, as the photosensitizer, either of a negative photosensitizer or a positive photosensitizer may be used. For example, a photosensitizer such as Su-8, a photosensitizer such as AZ 4230, or the like, may be used, but this should not be considered to be limiting in the art.

Hereinafter, a superhydrophobic substrate according to an embodiment and a method of manufacturing the same will be described in detail, but those are not limiting.

Embodiment (1) Fabrication of Photomask

1) An average interval is set to 20 µm to form single cells based on a voronoi diagram and circular shaped patterns having a diameter of 3 µm are centered on centers of gravity of the voronoi diagram pattern single cells. Then, a plurality of circular shaped patterns arrayed in the pseudo random fashion to have a pseudo random distribution, are formed by removing the voronoi diagram patterns.

2) The designed pattern is transferred to a substrate formed of a quartz material on which a chrome thin film is formed and photoresist is coated thereon, such that the transferred photoresist is embodied to have a shape.

3) The chrome thin film is etched by using a photoresist pattern generated after developing as a film, and then, remaining photoresist is removed.

4) After the removal of photoresist and cleaning, it is determined whether or not a defect is present on a mask, and a defect is repaired to thus complete a photomask.

As described above, the fabricated photomask includes a plurality of circular shaped light transmission parts having a diameter of 3 µm, the plurality of light transmission parts have a pseudo random distribution, and the average interval between the light transmission parts is 20 µm.

(2) Formation of Plurality of Protrusions on Substrate

1) A polymethyl methacrylate (PMMA) substrate is prepared, and a photosensitizer such as Su-8 is applied to one surface of the substrate.

2) The photomask fabricated in process (1) above is used in irradiating ultraviolet light to the photosensitizer layer to develop. After the developing, a region not exposed to light is removed to thereby manufacture a superhydrophobic substrate including a plurality of protrusions.

The plurality of protrusions formed in one surface of the manufactured superhydrophobic substrate have the pseudo random distribution, an average interval between the protrusions is 20 µm, and the protrusion has a diameter of 3 µm and a height of 10 µm.

(3) Coating of Substrate Surface with Hydrophobic Material

A surface of the manufactured superhydrophobic substrate is coated with polytetrafluoroethylene (PTFE).

Comparative Example

A hydrophobic substrate was manufactured through the same method as that of the above-described embodiment except for the formation of a pattern for a photomask by designing a pattern in which a plurality of diamond shapes are arrayed in a linear manner.

Figure 4:
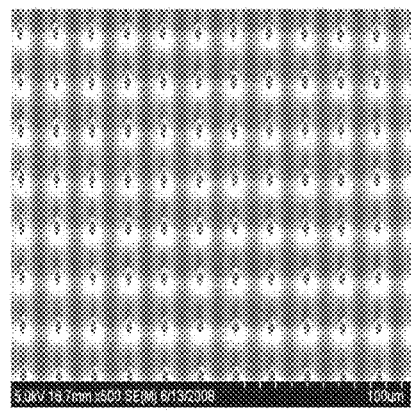
FIG. 4 is an SEM image of a hydrophobic substrate captured using a scanning electron microscope (SEM), illustrating a surface shape of the hydrophobic substrate, according to a comparative example.

FIG. 4 illustrates a surface shape of a hydrophobic substrate according to a comparative example. With reference to FIG. 4, a plurality of protrusions formed in one surface of the hydrophobic substrate according to the comparative example have a diamond shape and are two-dimensionally arrayed in a linear manner, an average interval between the protrusions is 20 µm, and the protrusion has a diameter of 3 µm and a height of 10 µm.

In the results described above, the hydrophobic substrate according to the embodiment is similar to the hydrophobic substrate according to the comparative example in that the average interval between the protrusions formed in the surface of the hydrophobic substrate according to the embodiment is greater than a visible light wavelength, but is different from the hydrophobic substrate according to the comparative example in that the protrusions have the pseudo random distribution.

Experimental Example (1) Measurement of Contact Angle

A contact angle on a superhydrophobic substrate surface was measured using a dsa-100 contact angle measuring device by Kruss.

(2) Measurement of Haze

Transparency of the superhydrophobic substrate was measured using an HR-100 by Murakami color research lab.

In the superhydrophobic substrate manufactured according to the embodiment, a contact angle on a surface thereof was measured as 154 degrees and a haze value thereof was 1.7.

In the hydrophobic substrate manufactured according to the comparative example, a contact angle on a surface thereof was measured as 151 degrees and a haze value thereof was 18.7.

It could be confirmed from the above-mentioned results that the superhydrophobic substrate according to the embodiment simultaneously had an excellent contact angle and excellent transparency as compared with the hydrophobic substrate according to the comparative example. This is why, unlike the comparative example, the protrusions according to the embodiment are arrayed at an interval greater than a visible light wavelength and have the pseudo random distribution such that transparency may be secured.

As set forth above, according to embodiments of the inventive concept, a superhydrophobic substrate may have excellent durability and transparency and may have ease of manufacturing, and manufacturing costs thereof are decreased.

In a method of manufacturing a superhydrophobic substrate according to an embodiment, the size and distribution of protrusions formed in a substrate surface may be adjusted and a large area of substrate can be easily manufactured.

While the inventive concept has been shown and described in connection with embodiments, it will be apparent to those skilled in the art that modifications and variations can be made without departing from the spirit and scope of the present inventive concept as defined by the appended claims.

What is claimed is:

1. A superhydrophobic substrate comprising:
   a plurality of protrusions having a pseudo random distribution corresponding to a voronoi diagram on one surface thereof, an average interval between respective protrusions among the plurality of protrusions being greater than an interval between light beam wave peaks of light within the visible spectrum,
   wherein an interval between respective protrusions among the plurality of protrusions adjacent to one another satisfies a normal distribution,
   wherein the average interval between respective protrusions among the plurality of protrusions is within a range of 0.4 μm to 100 μm,
   wherein a standard deviation of the normal distribution is within a range of 1/20 to 1/4 of an average value of the normal distribution,
   wherein a diameter of the protrusions is within a range of 5% to 30% of the average interval between the respective protrusions among the plurality of protrusions, and
   wherein a height of the plurality of protrusions is within a range of 15 to 90% of the average interval between the respective protrusions among the plurality of protrusions.

2. The superhydrophobic substrate of claim 1, wherein a haze value of the superhydrophobic substrate is 2 or less.

3. The superhydrophobic substrate of claim 1, further comprising a coating layer formed of a hydrophobic material on a surface of the superhydrophobic substrate including the plurality of protrusions.

4. The superhydrophobic substrate of claim 3, wherein the hydrophobic material is a fluorine-based compound or a silane-based compound.

5. A method of manufacturing a superhydrophobic substrate, comprising:
   a) fabricating a photomask including a plurality of light transmission parts or a plurality of light blocking parts, having pseudo random distribution corresponding to a voronoi diagram, an average interval between the plurality of light transmission parts or between the plurality of light blocking parts being greater than an interval between light beam wave peaks of light within the visible spectrum thereof,
   wherein the average interval between the light transmission parts or between the light blocking parts is within the range of 0.4 μm to 100 μm, and
   wherein a diameter of the light transmission part or the light blocking part in the a) fabricating of the photomask is within a range of 5% to 30% of the average interval between the light transmission parts or between the light blocking parts; and
   b) forming a plurality of protrusions on a substrate surface by using the photomask fabricated in a) the fabricating of the photomask,
   wherein the plurality of protrusions have a pseudo random distribution on one surface thereof,
   wherein an interval between respective protrusions among the plurality of protrusions adjacent to one another satisfies a normal distribution,
   wherein a standard deviation of the normal distribution is within a range of 1/20 to 1/4 of an average value of the normal distribution,
   wherein the average interval between respective protrusions among the plurality of protrusions is within a range of 0.4 μm to 100 μm,
   wherein a diameter of the protrusions is within a range of 5% to 30% of the average interval between the respective protrusions among the plurality of protrusions, and
   wherein a height of the plurality of protrusions is within a range of 15 to 90% of the average interval between the respective protrusions among the plurality of protrusions.

6. The method of claim 5, wherein the a) fabricating of the photomask is performed using a pattern design method employing a Voronoi diagram.

7. The method of claim 5, further comprising coating the substrate surface on which the plurality of protrusions are formed with a hydrophobic material.

8. A display device comprising the superhydrophobic substrate of claim 1.

9. Window glass for a vehicle comprising the superhydrophobic substrate of claim 1.

* * * * *